United States Patent
Huang et al.

(10) Patent No.: US 7,375,562 B2
(45) Date of Patent: May 20, 2008

(54) PHASE LOCKED SYSTEM FOR GENERATING DISTRIBUTED CLOCKS

(75) Inventors: Cheng-Yen Huang, Hsinchu (TW); Chi-Jui Chung, Kaohsiung (TW); Chia-Ying Wang, TanZi Township, Taichung County (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 11/225,280

(22) Filed: Sep. 13, 2005

(65) Prior Publication Data
US 2006/0214708 A1   Sep. 28, 2006

(51) Int. Cl.
*H03L 7/06* (2006.01)
(52) U.S. Cl. ...................... 327/156; 327/159
(58) Field of Classification Search ........ 327/146–148, 327/150–151, 154–157, 159, 162–163; 331/17, 331/25, DIG. 2, 34, 1 A, 1 R; 375/373–376; 348/537; 455/260
See application file for complete search history.

(56) References Cited

U.S. PATENT DOCUMENTS

| | | | |
|---|---|---|---|
| 4,791,488 A * | 12/1988 | Fukazawa et al. ......... 348/537 |
| 5,304,954 A * | 4/1994 | Saito et al. ................. 331/1 A |
| 6,386,512 B1 | 5/2002 | Pecot et al. ............... 254/134.4 |
| 7,154,344 B2 * | 12/2006 | Thies et al. ..................... 331/16 |
| 2003/0060177 A1 * | 3/2003 | Noboru et al. ............... 455/260 |
| 2005/0275473 A1 * | 12/2005 | Thies et al. .................... 331/34 |

* cited by examiner

*Primary Examiner*—Kenneth B. Wells
*Assistant Examiner*—Ryan C Jager
(74) *Attorney, Agent, or Firm*—Winston Hsu (57) ABSTRACT

A PLL apparatus and system for generating distributed clocks are disclosed. A synchronizing-edge detector is provided to the PLL apparatus in the PLL system to detect synchronizing edges of the input and output clock signals having gear relationship for the PLL apparatus. The synchronizing-edge detector detects a sample signal the frequency of which is the common divisor of the frequencies of the input and output signal. The PLL apparatus may be provided with a detection terminal connected with one of the input terminals of a pre-divider and loop divider for outputting the sample signal. Alternatively, the PLL system can comprise at least one additional divider coupled to the input and/or output signals of a PLL apparatus to generate the sample signal.

14 Claims, 12 Drawing Sheets

PHASE LOCKED SYSTEM FOR GENERATING DISTRIBUTED CLOCKS

BACKGROUND

The invention relates to distributed clock circuits and more particularly to a method and circuit of detecting synchronizing edges in a PLL system.

Demands created by high-speed electronic equipment have generated a number of problems for circuit designers and manufacturers. For example, many applications require that two subsystems running at different frequencies communicate with each other. Generally, logic running at a given clock frequency is said to be operating in a clock domain.

This synchronization problem has been previously addressed either by a single clock system architecture, which eliminates the number of clock domains, or by a multiple clock system architecture, which adds synchronization logic. Although utilizing a single clock system is simple, straightforward and low cost, each subsystem in the single clock system may not be optimized to its fullest potential, downgrading overall system performance. Also, there are practical limitations as to how many components a single clock source may support. Thus, a single clock system is not always feasible in most situations.

Alternatively, in multiple clock system architecture, dual ports or/and two port memories are required to transform blocks of information between different clock domains. This enables each subsystem to be optimized to its fullest potential, providing a robust solution. However, the dual port or/and tow port memories produce additional hardware cost. Additionally, the synchronization logic between different clock domains causes synchronization delay and meta-stability problems, adding latency. The disparity between the clock domains often includes different frequencies and/or phases, complicating the synchronization circuit design and adding significantly to the latency cost.

U.S. application Ser. No. 6,836,521 discloses a distributed clock generator loop based on gear ratio and phase alignment techniques to address the synchronizing problem while minimizing any latency caused by the additional synchronization circuitry. A gear ratio means that the clocks are related by a ratio, such that each clock has a different integer number of clock cycles in a common period. Also, in addition to a gear ratio relationship, the clocks may have a synchronized edge at the end of the common period to be phase aligned. For each clock, the cycles in the common period are "colored", i.e., identified by a number (1st, 2nd, etc.). Using the coloring technique, the appropriate clock edge for a data or control signal transfer can be identified. The edges are preferably chosen to minimize latency of the transfer. The distributed clock generator loop enables each subsystem to be optimized to its fullest potential, providing a robust solution at lower costs than a multiple clock system.

Figure 1:
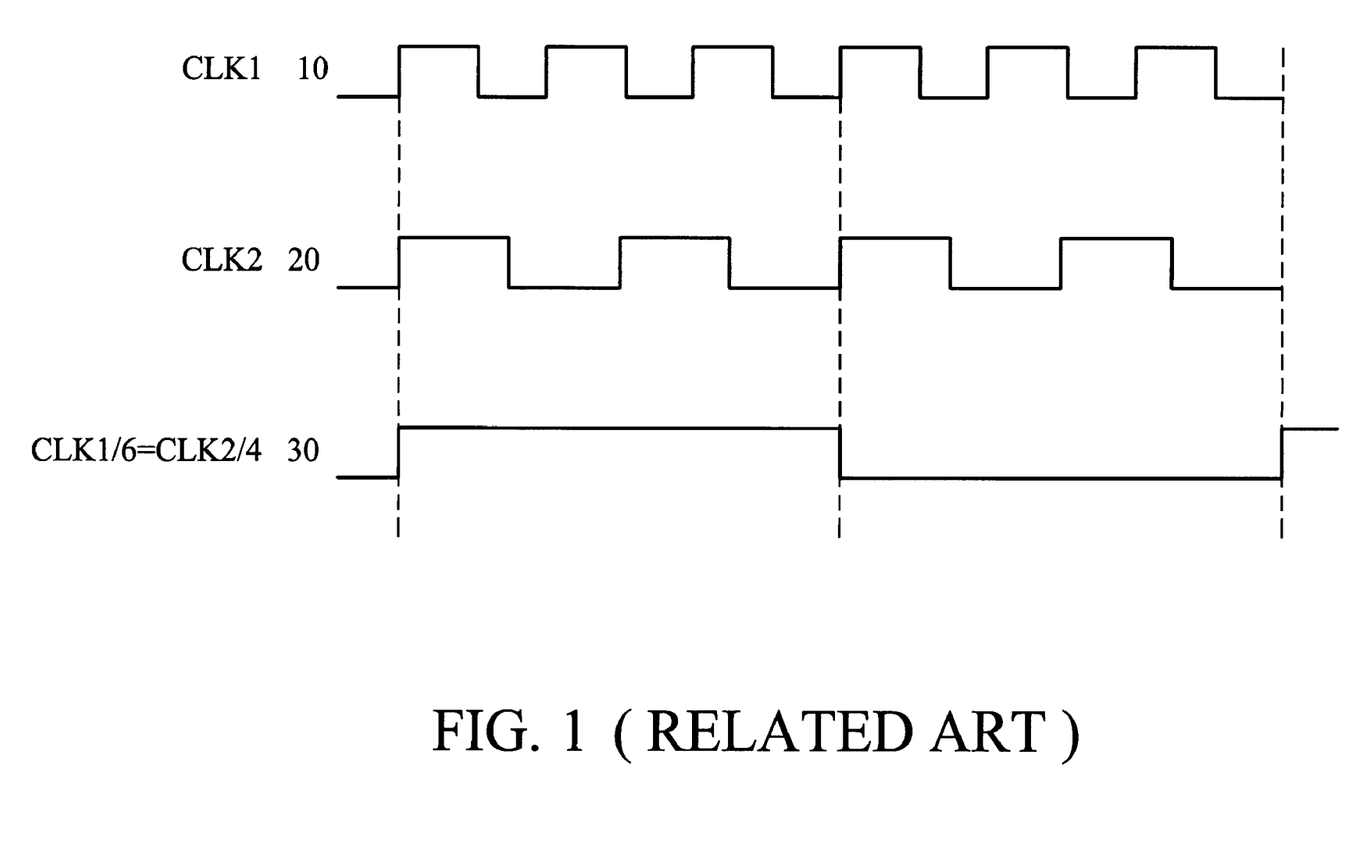
FIG. 1 shows clock waveforms of an exemplary gear ratio relationship.

FIG. 1 shows clock waveforms of an exemplary gear ratio wherein three cycles of clock CLK1 10 equal two cycles of clock CLK2 20, or 3* (cycle of CLK1)=2* (cycle of CLK2). As shown, CLK1 and CLK2 are phase aligned at the end of the common period. Since gear ratio is defined as the ratio of the two clock frequencies, in this example the gear ratio of CLK1/CLK2 is 3/2. If clock signals CLK1 10 and CLK2 20 are divided by 6 and 4, respectively, a clock signal 30 results which is equal to CLK1/6 or CLK2/4.

Figure 2:
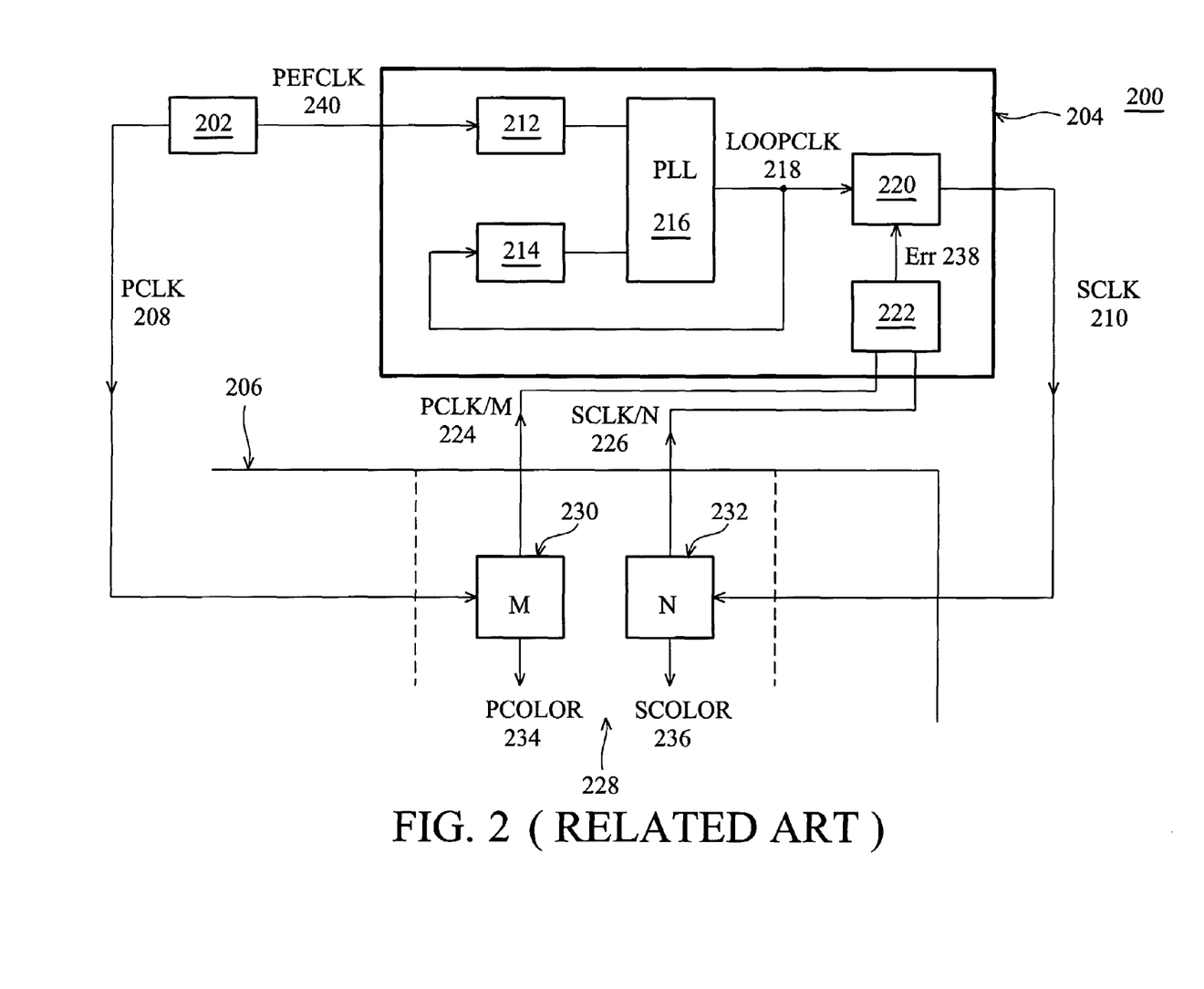
FIG. 2 is a schematic diagram of a conventional distributed clock generator loop.

FIG. 2 shows a distributed generator loop 200 applied to a Memory Control Unit 206 with two clock domains operating in gear ratio fashion disclosed in U.S. application. Ser. No. 6,836,521. The architecture contains a clock source 202, a distributed clock generator (DCG) 204, and Memory Control Unit 206 with logic running in two clock domains, PCLK 208 and SCLK 210. The clock source 202 generates PCLK 208 for Memory Control Unit 206 and a reference signal PEFCLK 240 for the distributed loop. DCG 204 receives PEFCLK 240. PEFCLK 240 is multiplied utilizing clock dividers, 212 and 214, and a phase-locked loop (PLL) 216 to generate LOOPCLK 218 of another frequency. The output of PLL 216 is a phase aligner 220. The output frequency of the phase aligner 220 is equal to its input frequency, but the output phase is delayed from the input phase by an error signal Err 238 output from a phase detector 222.

The phase detector compares the relative phases of PCLK_M 224 and SCLK_N 226 from a gear ratio Logic 228 in Memory Control Unit 206 and outputs the error signal Err 238 to drive the phase aligner 220 until the phase of SCLK_N 226 matches the phase of PCLK_M 224. When the output phase of the phase aligner 220 changes, the phase of SCLK 210 will have the same amount of phase change, and phase error between PCLK 208 and SCLK 210 is minimized.

FIG. 2 shows two sub-blocks 230 and 232 in gear ratio Logic 228. The sub-block 230 divides PCLK 208 by M to generate PCLK_M 224 and PCOLOR 234,; and the clock divider 232 divides SCLK 210 by N to generate SCLK_N 226 and SCOLOR 236. The two divided clocks, PCLK_M 224 and SCLK_N 226, as described, are output from Memory Control Unit 206 and passed back to DCG 204 as inputs to the phase detector 222.

Figure 3:
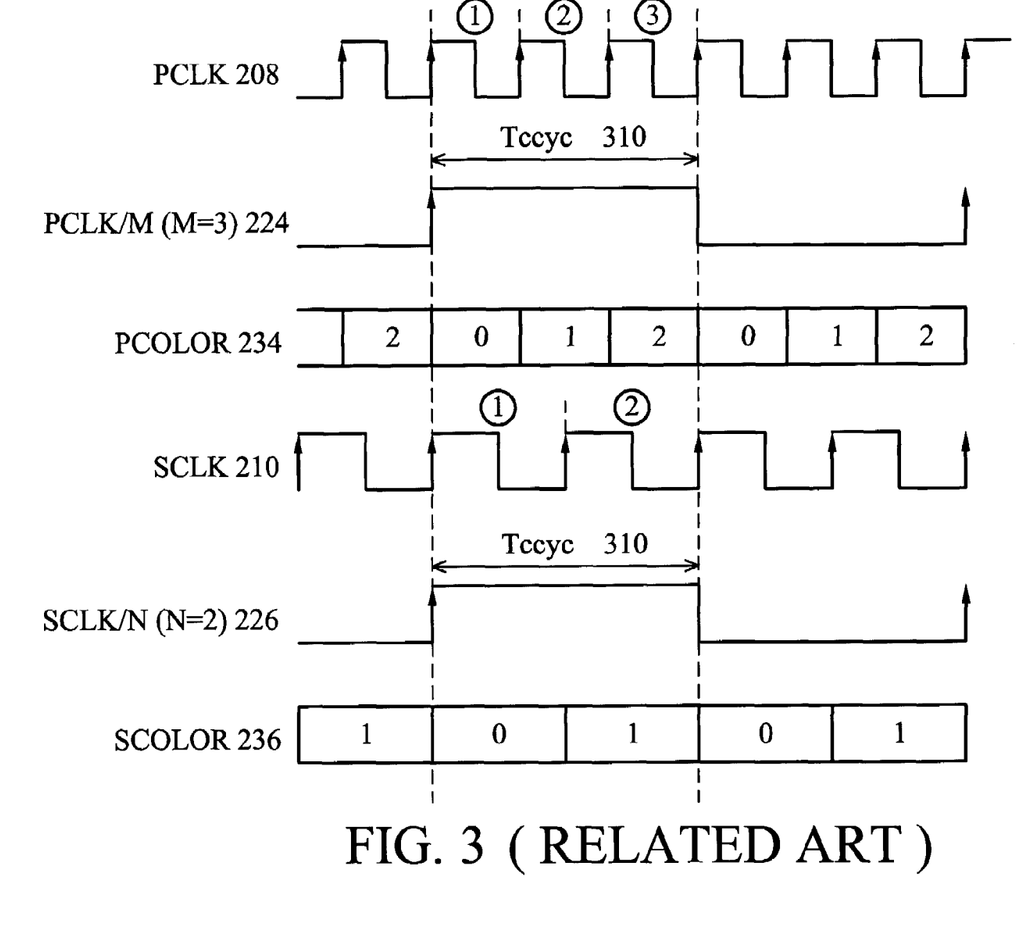
FIG. 3 is a timing diagram of gear ratio Logic signals with a 3/2 gear ratio in the conventional distributed clock generator loop of FIG. 2.

FIG. 3 shows a timing diagram of signals associated with gear ratio Logic 228 with a 3/2 gear ratio. The cycle time of SCLK 210 is 3/2 times the cycle time of PCLK 208. PCOLOR 234 is incremented from a value 000 through a value 010 (i.e., 000, 001, 010) on each edge of PCLK 208. When PCOLOR 234 reaches a maximum value 010, PCOLOR 228 clears to 000 and in turn, toggles the value of PCLK/M 224. Thus, PCLK/M 224 alternates from 0 to 1 every three cycles of PCLK 208, or one cycle Tccyc 310.

On the other hand, SCOLOR 236 reaches a maximum value of 001 in this example, at which point the value of SCOLOR 236 clears to 000 and in turn, toggles the value of SCLK/N 226. Thus, SCLK/N 226 alternates from 0 to 1 every two cycles of SCLK 210, or one cycle TCCYC 310.

In a 3/2 configuration, PCOLOR 234 and SCOLOR 236 indicate the value of counts in progress for PCLK 208 and SCLK 210, respectively. PCOLOR 234 is asserted for three cycles of PCLK 208 (as shown by encircled 1, 2, and 3) and SCOLOR 236 is asserted for two cycles of SCLK 210 (as shown by encircled 1 and 2). Thus, PCLK/M 224 and SCLK/N 226 measure the relative phase of PCLK 208 and SCLK 210. Furthermore, as shown in FIG. 2, PCLK/M 224 and SCLK/N 226 are driven to a clock generator 220. Hence, SCLK 210 becomes a phase-aligned clock signal.

The value for PCOLOR 234 indicates when data read and write operations should take place to ensure data transfer at correct edges, referred to as color coding scheme.

However, the complex logics are introduced due to the phase align logics, gear logics and so on. This may make the implementation uneasy and inefficient. Additionally, if M and N are not co-prime numbers, the synchronizing edges of PCLK 208 and SLK 210 within the longer Tccyc 310 are wasted and the performance are thus degraded.

In view of this disadvantage, a new method and apparatus is disclosed to detect the synchronizing edges of the clocks in different domains which can be used to indicate when data read and write operations should take place in a digital system while having higher performance, speed and lower cost and also can be migrated into the new manufacturing process and conventional PLL easily.

SUMMARY

The invention provides a method and system of detecting synchronizing edges of two clock signals having a gear relationship for generation of distributed clocks for a system with multiple clock domains.

A detection terminal is added to a conventional PLL apparatus to form a new PLL apparatus. A sample signal at one of the input terminals of a phase comparator in the conventional PLL is accessed through the detection terminal, detecting the synchronizing edges of the input and output clock signals of the new PLL apparatus, since the sample signal has a frequency which is a common divisor of the input and output clock signals of the new PLL apparatus.

Alternatively, at least one divider can be coupled to the input or/and output signal of a conventional PLL apparatus to generate a sample signal for the synchronizing edges of the input and output clock signals for the PLL apparatus.

The invention also provides a synchronizing-edge detector to detect synchronizing edges of the input and output clock signals for a PLL apparatus using a sample signal obtained as described and a reference signal selected from the input and output clock signals of the PLL apparatus as long as the sample signal has a frequency of a common divisor of the input and output clock signals of the new PLL apparatus. The synchronizing-edge detector comprises a counter generating a counting signal incremented on each edge of the reference signal selected from one of the first and second clock signals, a global reset module generating a global signal asserted by the rising edges of the sample clock signal resetting the counting signal, a local reset module to generate a local signal resetting the counting signal together with the global signal, wherein the local signal is asserted by the counting signal when the counting signal reaches a first value.

BRIEF DESCRIPTION OF THE DRAWINGS

The foregoing and other advantages and features of the invention will become more apparent from the detailed description of exemplary embodiments of the invention given below with reference to the accompanying drawings in which.

DETAILED DESCRIPTION

Figure 4:
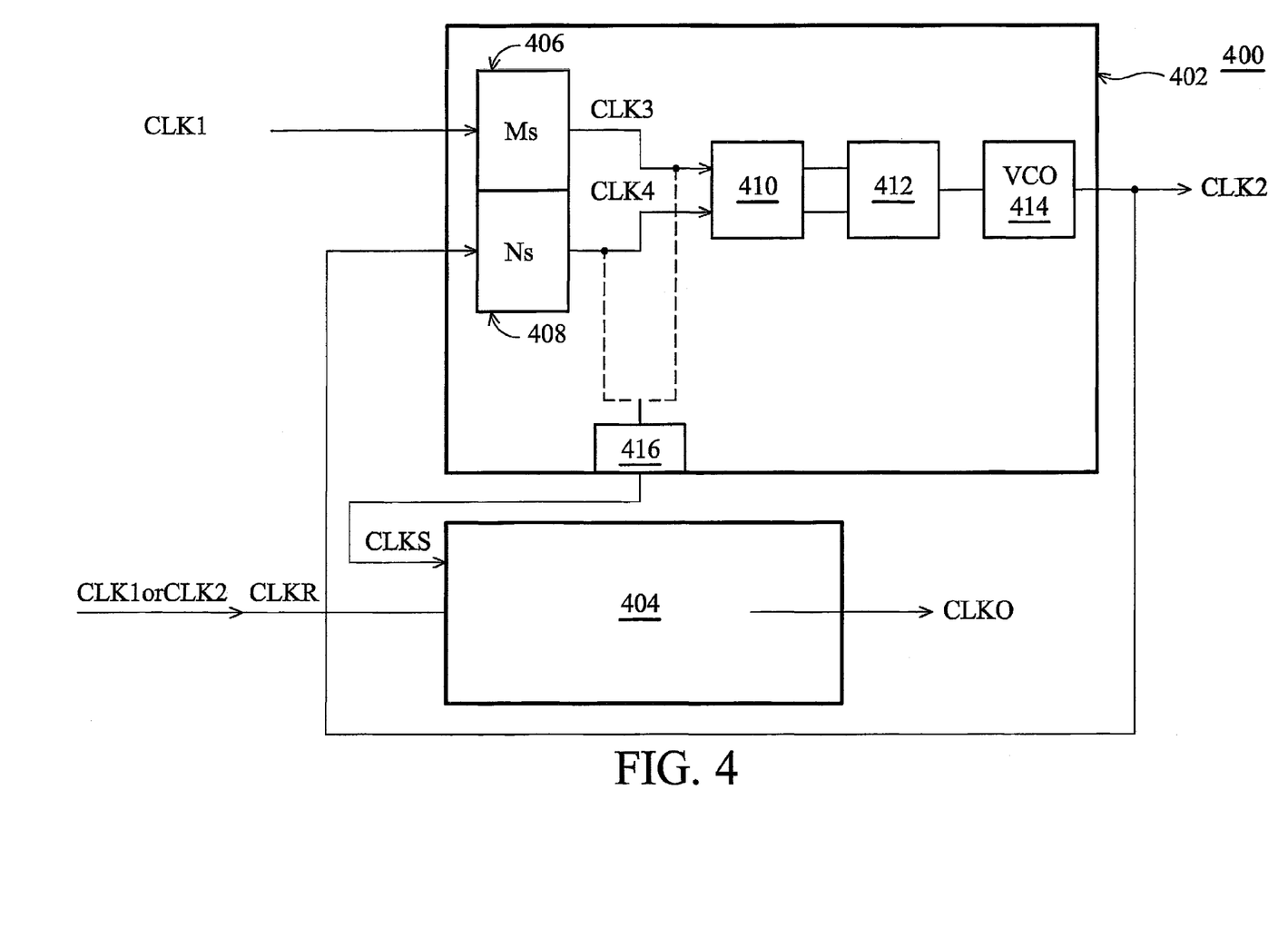
FIG. 4 is a schematic diagram of a phase locked loop system in accordance with an embodiment of the invention.

FIG. 4 is a schematic diagram of a phase locked loop (PLL) system 400 in accordance with an embodiment of the invention. The PLL system 400 includes a PLL apparatus 402 and a synchronizing-edge detector 404. The PLL apparatus 402 receives a first clock signal CLK1 of frequency f1 to provide a second clock signal CLK2 of frequency f2, wherein f2 has a gear relationship with f1. The synchronizing-edge detector 404 produces an output clock signal CLKO indicative of synchronizing edges of the first and second clock signals. The PLL apparatus 402 can be implemented as an integrated circuit alone or can be integrated with the synchronizing-edge detector 404 into a single integrated circuit.

Typically, the PLL apparatus 402 comprises a pre-divider 406 dividing the first clock signal CLK1 by an integer MS into a third clock signal CLK3 of frequency f3 (that is, f3=f1/MS), a loop-divider 408 dividing the second clock signal CLK2 by an integer NS into a fourth clock signal CLK4 of frequency f4 (that is, f4=f2/NS), wherein f3=f4 as the PLL apparatus 402 is in lock, a phase comparator 410 making a comparison between the third and fourth clock signal, a charge pump circuit 412 producing a control voltage in accordance with the output of the phase comparator 410, a voltage-controlled oscillator 414, the oscillation frequency of which is controlled by the control voltage of the charge pump circuit 412 to generate the second clock signal CLK2, and a detection terminal 416 connected to the third or fourth clock signal. The detection terminal 416 can be electrically connected outwards to provide a sample clock signal CLKS selected from the third and fourth clock signals for the detection of the synchronizing edges of the first and second clock signals. One unique portion of the invention is that the detection terminal 416 is added to a conventional PLL apparatus not limited to any specific type. The detection terminal 416 is carefully routed such that the sample clock signal CLKS at the detection terminal 416 and the output signal of the pre-divider 406 or the loop-divider 408 chosen to be the sample clock signal CLKS have the same latency and no time skew.

Figure 5:
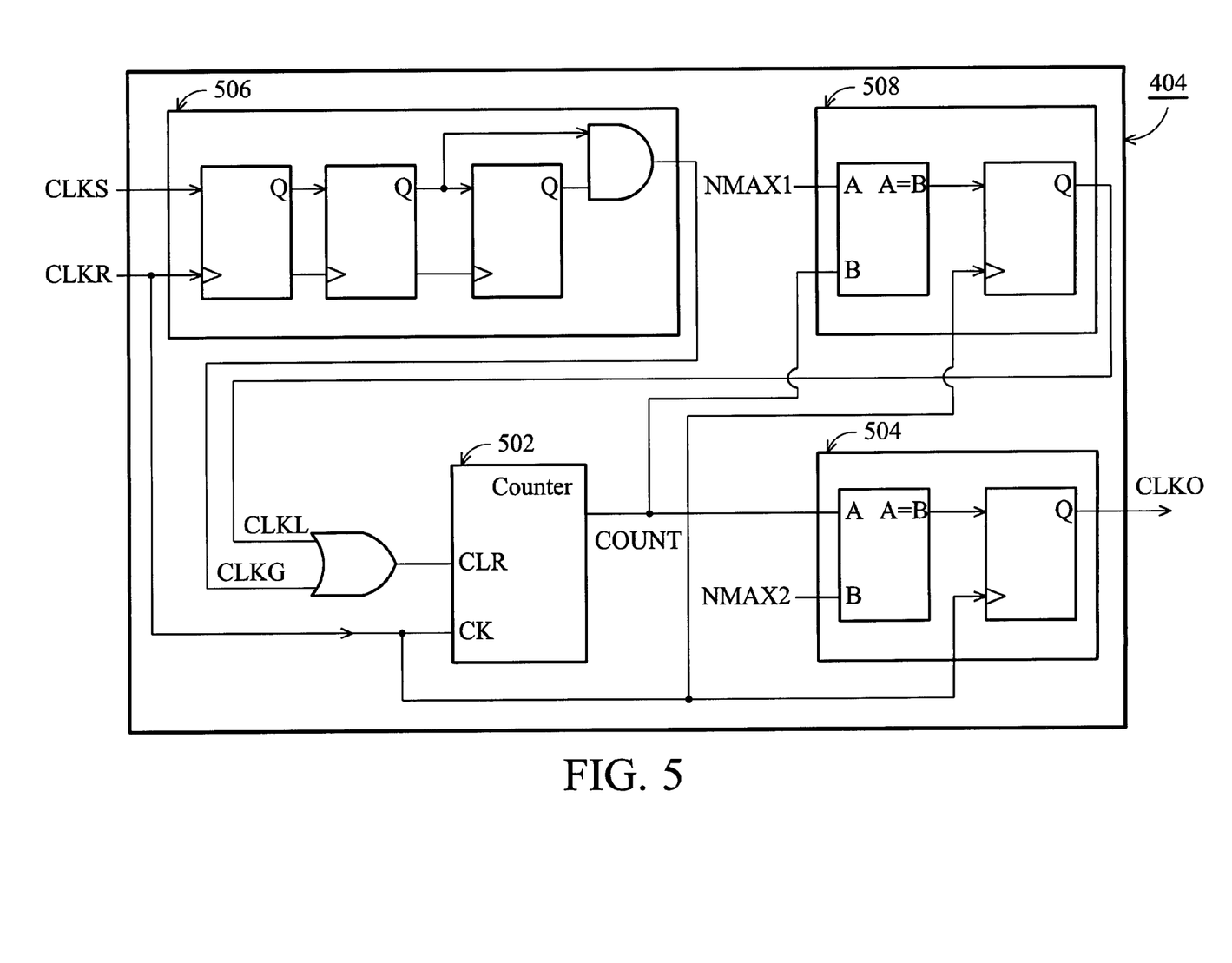
FIG. 5 is a schematic diagram of a synchronizing-edge detector in accordance with an embodiment of the invention.

FIG. 5 is a schematic diagram of a synchronizing-edge detector 404 in accordance with an embodiment of the invention. The synchronizing-edge detector 404 receives two signals, a sample clock signal CLKS selected from the third and fourth clock signals, and a reference signal CLKR selected from the first and second clock signals. Counter 502 generates a counting signal COUNT measuring the time after the rising edge of the sample clock signal CLKS. The counting signal COUNT is incremented on each edge of the reference signal CLKR and cleared by a global reset signal CLKG or a local reset signal CLKL. Global reset circuit 506 asserts the global reset signal CLKG when detecting each rising edge of the sample clock signal CLKS. Local reset circuit 508 asserts the local reset signal CLKL whenever the counting signal COUNT reaches a maximum value NMAX1, where $$NMAX1 = MAX(MS,NS)/GCD(MS,NS) - 1,$$

such that the cycle time of the local reset signal CLKL is equal to that of the synchronizing edges of the first and second clock signals. Informing circuit 504 asserts output clock signal CLKO each time the counter 506 reaches a fixed value NMAX2. In one embodiment, the fixed value NMAX1=NMAX2. In such a process, the output clock signal CLKO is indicative of the synchronizing edges of the first and second clock signals and can be used to tell when data read and write operations should take place in a digital system with multiple clock domains. It is noted that the synchronizing-edge detector is skew tolerant. That is, the skew between the reference clock signal CLKR and the sample clock signal CLKS (shown as gray regions) is as tolerant as possible. Moreover, such configuration can achieve very high speed and performance.

Figure 6:
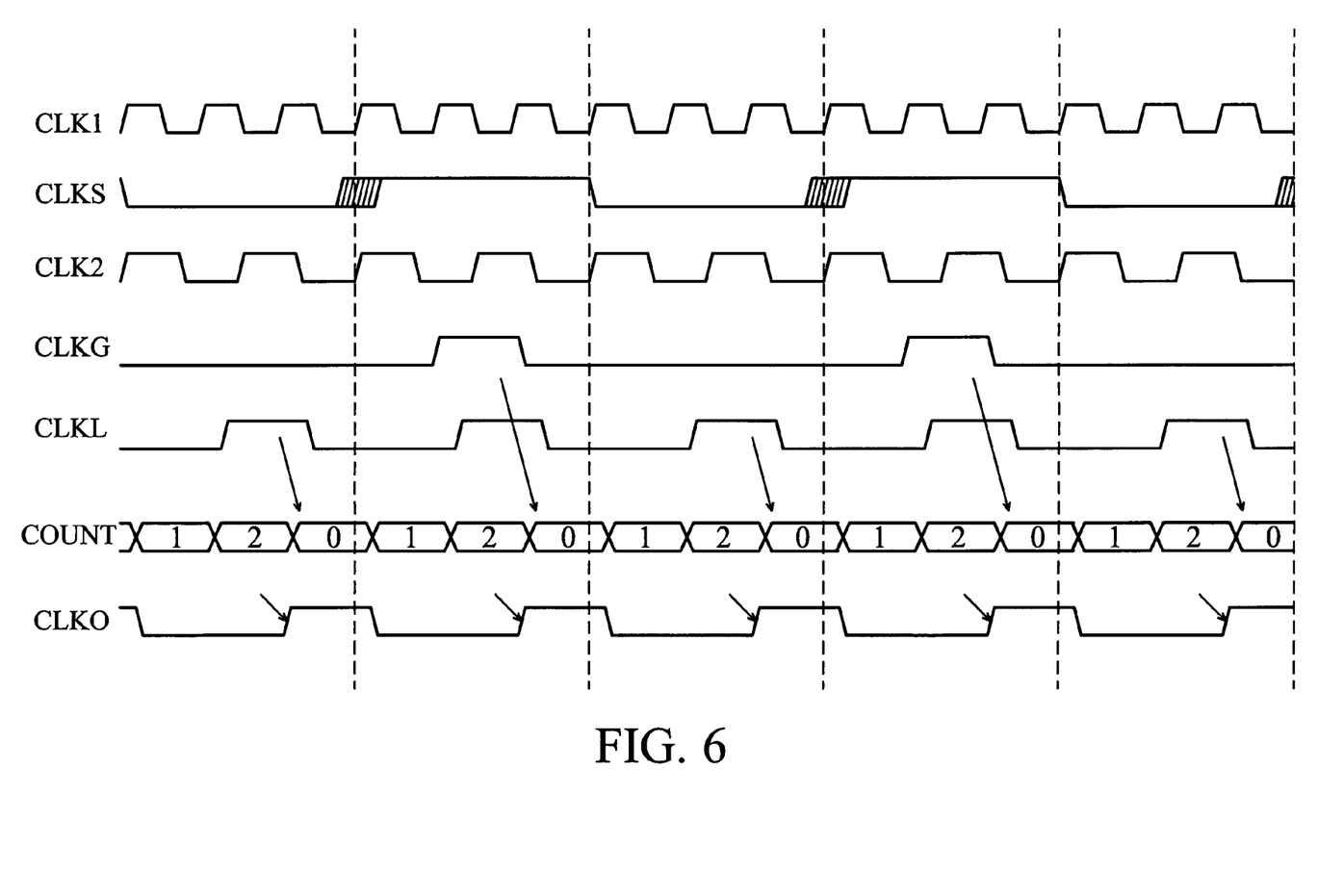
FIG. 6 is a timing diagram of signals associated with synchronizing-edge detector of FIG. 5 with (MS,NS)=(6,4) for PLL system of FIG. 4.

FIG. 6 is a timing diagram of signals associated with a synchronizing-edge detector 404 where MS=6 and NS=4 using the first clock signal CLK1 as the reference clock signal CLKR for illustration. In such a case, the cycle time of the first clock signal CLK1 is 6/4 times that of the second clock signal CLK2, that is, gear ratio is 6/4. The global reset signal CLKG is asserted at a fixed time after each rising edge of the sample clock signal CLKS. The counting signal COUNT as shown is incremented from 0 through 2 at a short time after each edge of the rising edge of the first clock signal CLK1. The counting signal COUNT is initially reset by the global reset signal CLKG, and when it reaches NMAX1 (2), the local reset signal CLKL is asserted, which in turn resets the counting signal COUNT to zero. In response, the output signal CLKO is asserted to indicate the synchronizing edges of the first and second clock signals.

In the embodiment, the cycle time of the global reset signal is equal to that of the synchronizing edges of the first and second clock signals. Therefore, in one period of the global reset, there occur twice the synchronizing edges of the first and second clock. One advantage of the invention over conventional edge-detecting, techniques is that even though MS and NS are not co-prime, every synchronizing edge of the first and second clock signals can be detected through the counting signal COUNT reset by the local reset signal CLKL.

Those with ordinary skill in the art should recognize that cycle time of the counting signal needs not be the same as that of the reference clock signal CLKR, for example, it can be ½, ⅓ and etc. Also, the configuration of the synchronizing-edge detector in FIG. 5 is illustrated only by way of example. Any other implementation capable of indicating the synchronizing edges by detecting the edges of the sample clock signal CLKS can be employed.

The sample clock CLKS needs not to be the third or fourth clock signal. Third and fourth clock can be used as the sample clock CLKS because their frequency is a common divisor of the first and the second clocks and can therefore generate the global reset signal CLKG to reset the counting signal COUNT. With the aid of the local reset signal CLKL, every synchronizing edge of the first and second clock signals can be detected. Thus, any other clock signal originating from the PLL apparatus can be employed as the sample clock signal CLKS as long as its frequency is a common divisor of the first clock and the second clocks. As shown, this allows the PLL apparatus to be any conventional PLL apparatus without modification.

Figure 7:
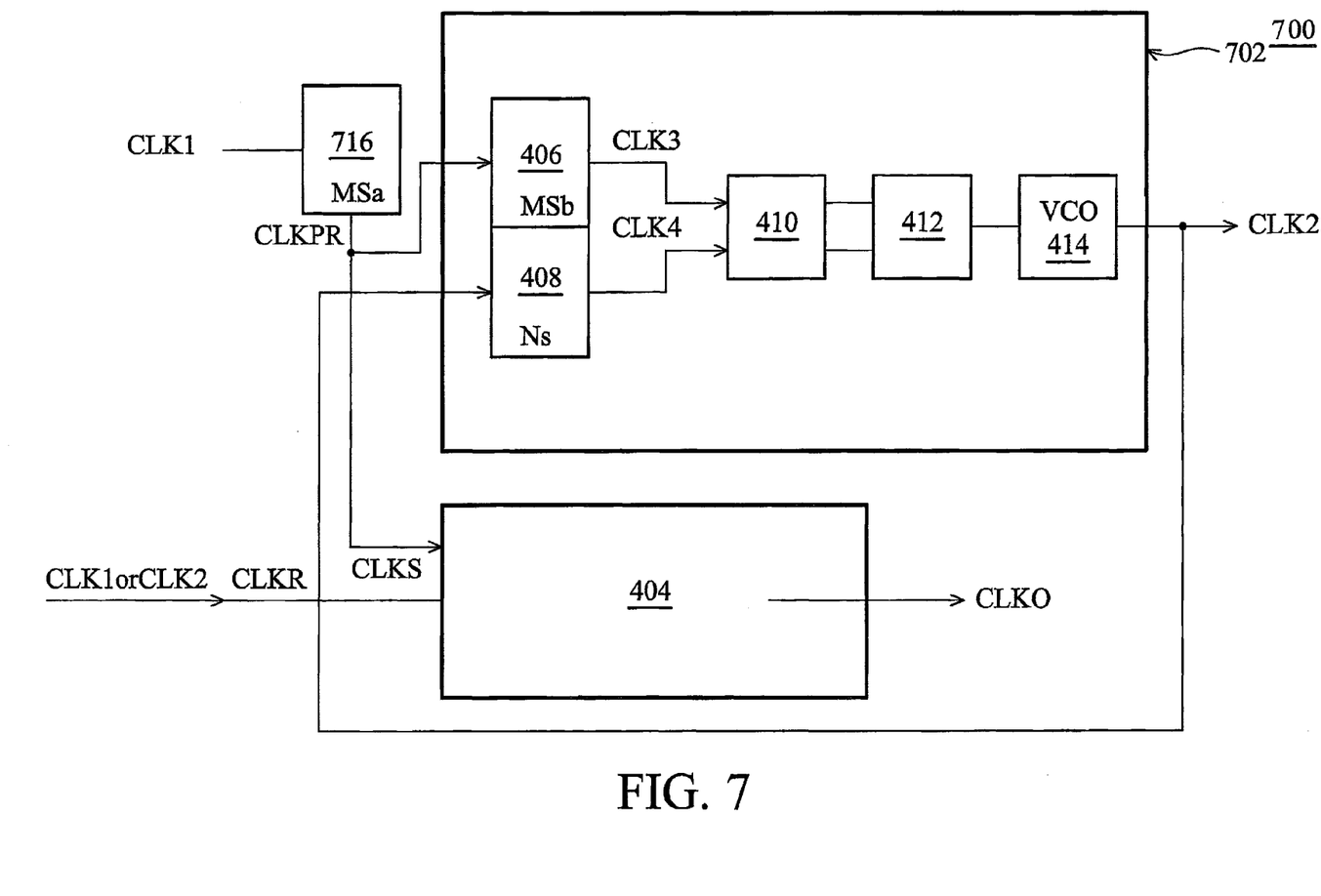
FIG. 7 is a schematic diagram of a synchronizing-edge detector in accordance with another embodiment of the invention.

FIG. 7 is a schematic diagram of a phase locked loop (PLL) system 700 in accordance with another embodiment of the invention. The PLL system 700 comprises a conventional PLL apparatus 702 receiving a first clock signal CLK1 of frequency f1 to provide a second clock signal CLK2 of frequency f2, wherein the first and second clock signals have a gear ratio relationship and f1=f2 when the PLL apparatus 702 is locked. The PLL system 700 further comprises a synchronizing-edge detector 404, and a first divider 716 dividing the first clock signal CLK1 by an integer MSa into a pre-reference clock signal CLKPR.

The conventional PLL apparatus 702 is not limited to any specific type and has a configuration known in the art. Typically, it comprises a pre-divider 406 dividing the pre-reference clock signal CLKPR by an integer MSb into a third clock signal CLK3 of frequency f3 (that is, f3=fpr/MSb, where fpr is the frequency of the pre-reference clock signal CLKPR.), a loop-divider 408 dividing the second clock signal CLK2 by an integer NS into a fourth clock signal CLK4 of frequency f4 (that is, f4=f2/NS), a phase comparator 410, a charge pump circuit 412, and a voltage-controlled oscillator 414, as well shown in the art. When the PLL apparatus 202 is in lock, f3=f4. That is, $$f1/f2 = MS/NS \qquad (1).$$

The pre-reference clock signal CLKPR is fed into both a pre-divider 406 of the PLL apparatus 702 and the synchronizing-edge detector 404 as a sample clock signal CLKS. That is, $$fpr = f1/MSa \qquad (2),$$

where fpr is the frequency of the pre-reference clock signal CLKPR.

Combining (2) with formula f3=fpr/Msb, we get f3=f1/(MSa*MSb). This means $$MS = MSa*MSb \qquad (3).$$

In the embodiment, MSb is required to be a divisor of NS, that is, $$LCM(NS,MSb) = NS \qquad (4),$$

where LCM(NS,MSb) is the least common multiple of NS and MSb.

Or in another expression, $$NS = MSb*I \qquad (4'),$$

where I is an integer.

This requirement renders the frequency fpr of the pre-reference clock signal CLKPR a common divisor of the frequencies of the first and second clock signal, such that the pre-reference clock signal CLKPR can be used as the sample clock signal CLKS. By combining the formulas (1), (2), (3) and (4') into $$fpr/1 = f2/I \qquad (5),$$

it can be seen clearly in (5) that fpr is a common divisor of the first and second clock signals.

Figure 8A:
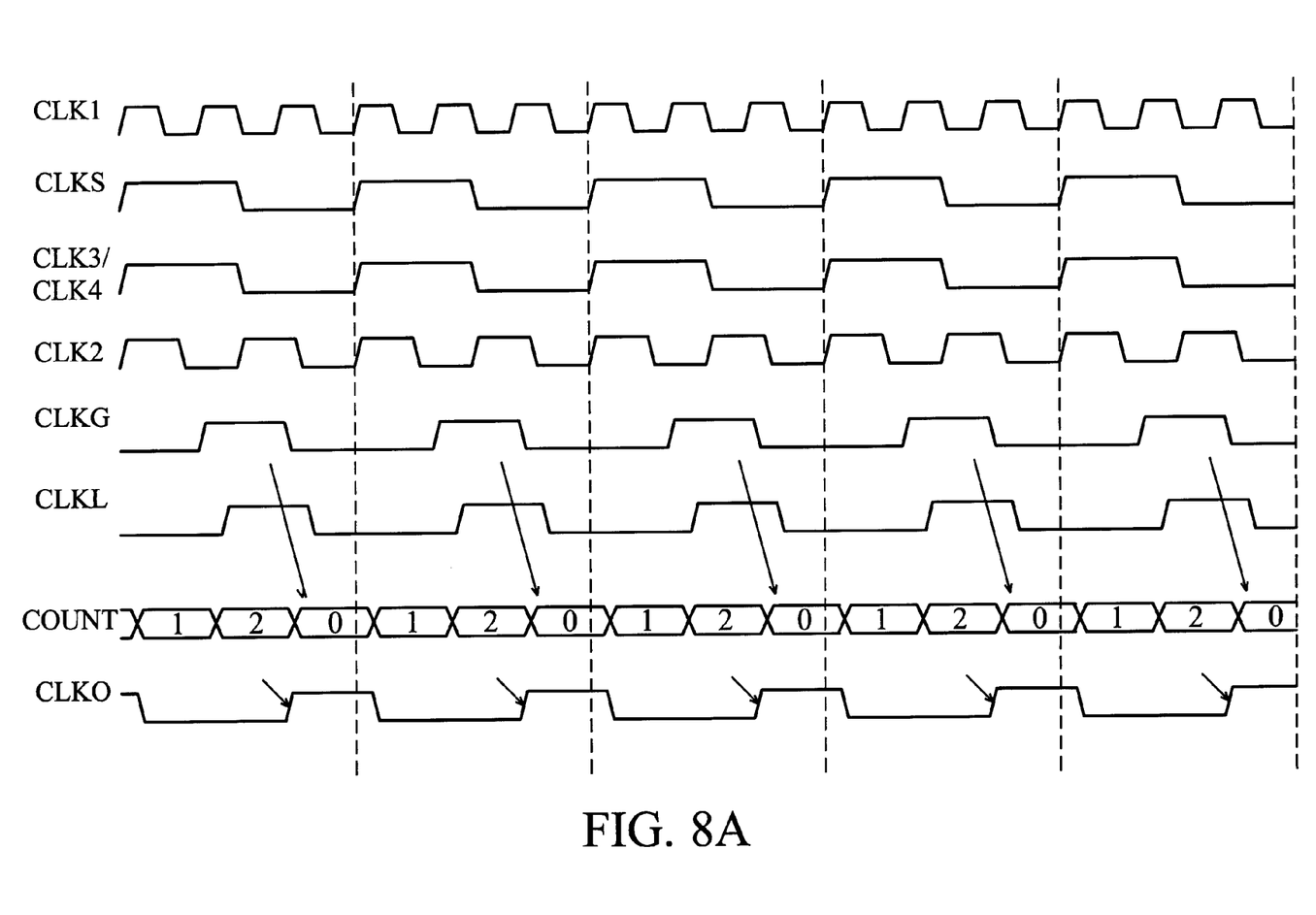
FIGS. 8a and 8b are timing diagrams of signals associated with synchronizing-edge detector of FIG. 5 with (MS, NS)=(6,4) and (3,2) respectively for PLL system of FIG. 7.

FIG. 8A shows a timing diagram of signals associated with the synchronizing-edge detector 404 with MS=6 and NS=4 (gear ratio is 6/4) and the first clock signal CLK1 as the sample clock signal CLKS for illustration. In such a case, MSb can be chosen as 2 to satisfy formula (4) and hence MSa=3. FIG. 8A is in all respects except one the same as FIG. 6. The difference is that the sample clock signal CLKS is the pre-reference clock signal CLKPR rather than the third or fourth clock signal. This causes the cycle time of the global reset signal CLKG to be half that in FIG. 5. However, this does not affect the timings of the local clock signal CLKL nor the counting clock signal COUNT. Resultingly, As shown in FIG. 8A, the global reset signal CLKG is asserted at a fixed time after each rising edge of the sample clock signal CLKS. The counting signal COUNT is incremented from 0 through 2 a short time after each edge of the rising edge of the first clock signal CLK1. The counting signal COUNT is initially reset by the global reset signal CLKG, and when it reaches 2, the local reset signal CLKL is asserted, which in turn resets the counting signal COUNT to 0. In response, the output clock signal CLKO is asserted to indicate the synchronizing edges of the first and second clock signals.

Figure 8B:
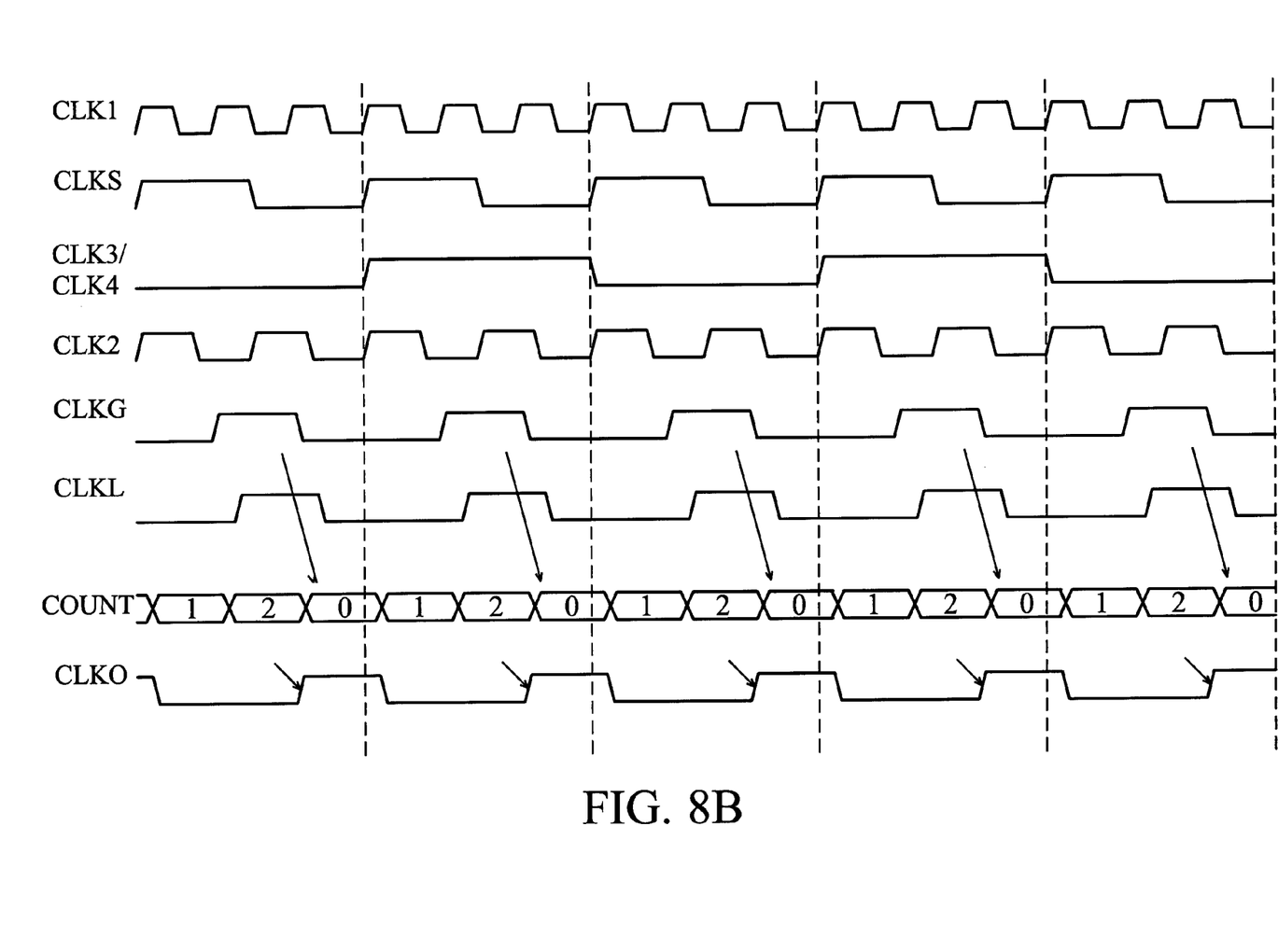

FIG. 8B is another timing diagram of signals associated with the synchronizing-edge detector 404 with MS=3 and NS=2 (gear ratio is 3/2) and the first clock signal CLK1 as the sample clock signal CLKS for illustration. In such a case, MSb can be chosen as 1 to satisfy formula (4) and hence MSa=3. FIG. 8B is in all respects except one the same as FIG. 8B. The difference is that the cycle time of the third or fourth clock signal is half that in FIG. 8B. However, this does not affect the timing of the global reset signal CLKG. Resultingly, the timing of the output clock signal CLKO does not change. As a result, the output signal CLKO accurately indicates the synchronizing edges of the first and second clock signals.

Figure 9:
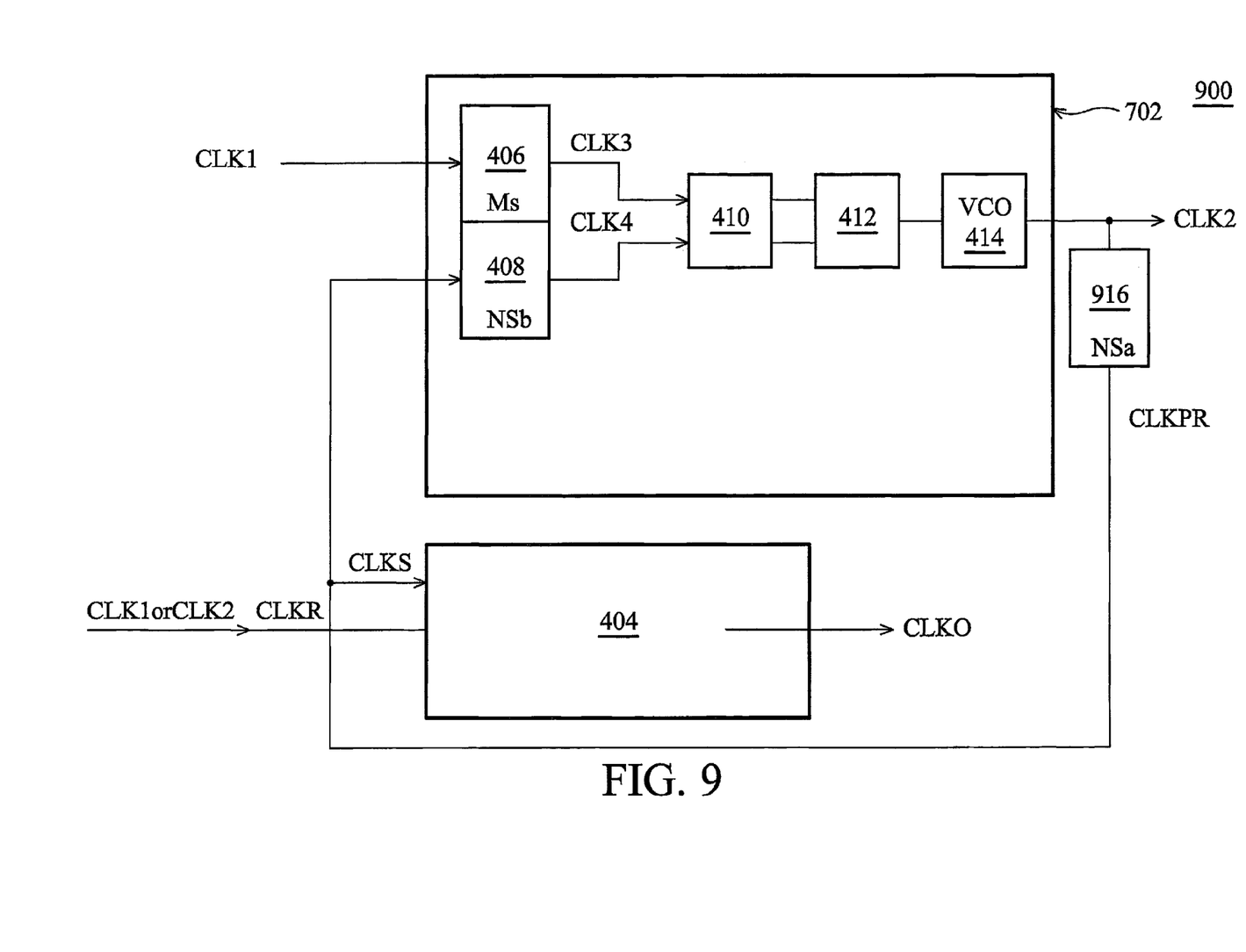
FIG. 9 is a schematic diagram of a synchronizing-edge detector in accordance with another embodiment of the invention.

FIG. 9 is a schematic diagram of a phase locked loop (PLL) system 900 in accordance with another embodiment of the invention. FIG. 9 is in all respects except one the same as FIG. 7 and formula (1) is still a target. The difference is that the first divider 716 dividing the first clock signal CLK1 by an integer MSa is now replaced by a second divider 916 dividing the second clock signal CLK2 by an integer NSa into a pre-reference clock signal CLKPR, that is, $$fpr = f2/NSa \quad (6),$$

where fpr is the frequency of the pre-reference clock signal CLKPR.

The pre-reference clock signal CLKPR is sequentially fed into the loop divider 408 and the synchronizing-edge detector 404 as the sample clock signal CLKs. THe loop-divider 408 divides the pre-reference clock signal CLKPR by NSb into the fourth clock signal CLK4 of frequency f4. That is, $$f4 = fpr/NSb \quad (7).$$

Combining formula (6) with formula (7), we get f4=f2/NSa*NSb, which means $$NS = NSa*NSb \quad (7').$$

In the embodiment, NSb is required to be a divisor of MS, that is, $$LCM(MS,NSb) = MS \quad (8),$$

where LCM(MS,NSb) is the least common multiple of MS and NSb. Or in another expression, $$MS = NSb*I \quad (8'),$$

where I is an integer.

By combining the formulas (1), (6), (7) and (8'), formula $$fpr/1 = f1/I \quad (9)$$

is obtained. Thus, referring to formulas (6) and (9), it can be seen clearly that fpr is a common divisor of the first and second clock signal. Thus, the pre-reference clock signal CLKPR can be used as the sample clock signal CLKS.

Figure 10:
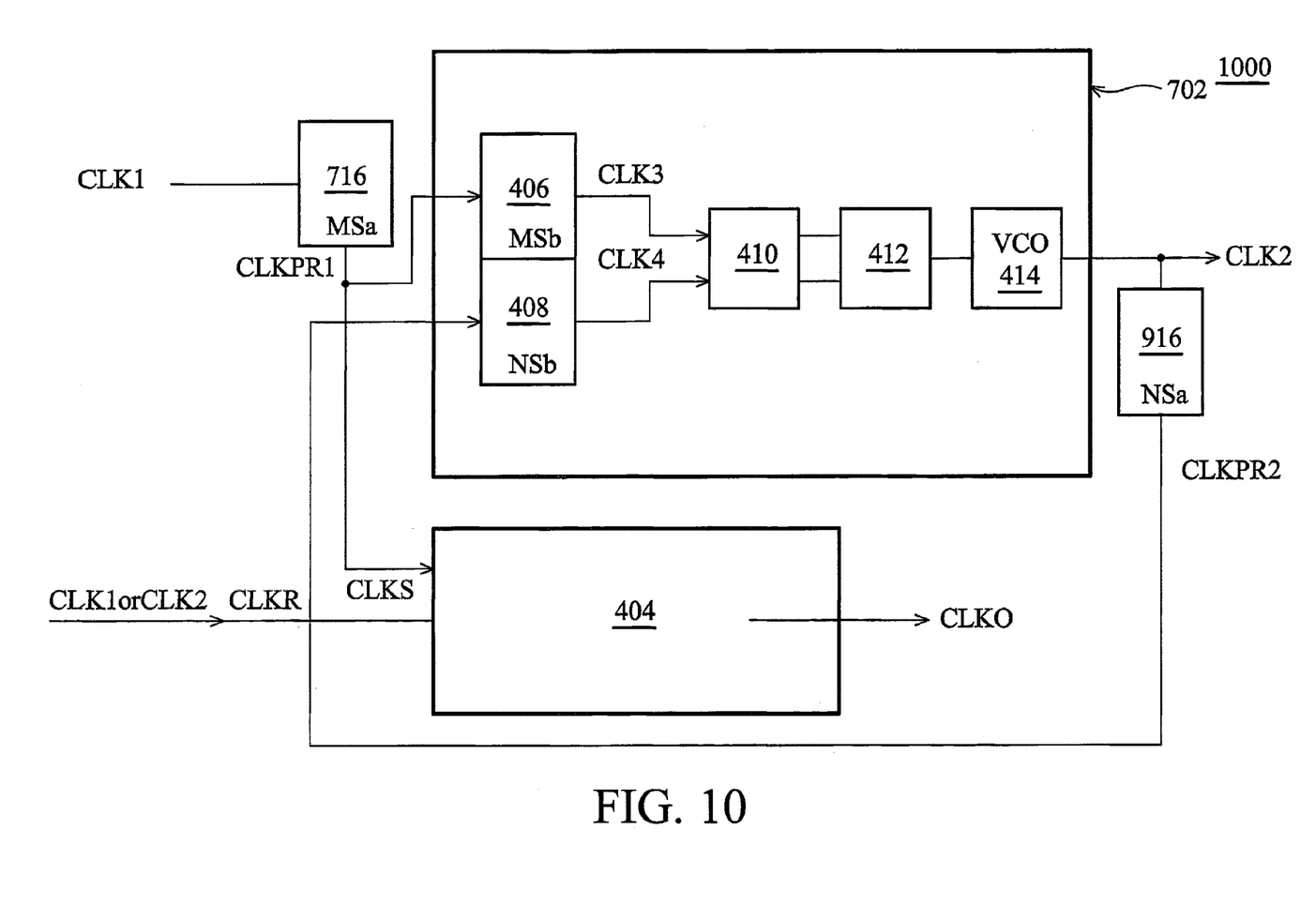
FIG. 10 is a schematic diagram of a synchronizing-edge detector in accordance with another embodiment of the invention.

FIG. 10 is a schematic diagram of a PLL system 1000 in accordance with another embodiment of the invention. The PLL system 1000 comprises a conventional PLL apparatus 702, a synchronizing-edge detector 404, a first divider 716 and a second divider 916. As shown, The PLL system 400 is in all respects except one the same as PLL system 700 of FIG. 7 and formula (1) is still a target. The difference is the addition of the second divider 916. The first divider 716 divides the first clock signal CLK1 by an integer MSa into a first pre-reference clock signal CLKPR1. The first pre-reference clock signal CLKPR1 is then fed into the pre-divider 406 and into the synchronizing-edge detector 404 as the sample clock signal CLKS, that is, $$fpr1 = f1/MSa \quad (10),$$

where fpr1 is the frequency of the first pre-reference clock signal CLKPR1.

The first pre-reference clock signal is then divided by the pre-divider 406 by an integer MSb into the third clock signal CLK3, that is, $$f3 = fpr1/Msb \quad (11).$$

Combining (10) with (11), we get f3=f1/MSa*MSb, which means $$MS = MSa*MSb \quad (11').$$

Similarly, the second divider 916 divides the second clock signal CLK2 by an integer NSa into a second pre-reference clock signal CLKPR2, that is, $$fpr2 = f2/NSa \quad (12).$$

where fpr2 is the frequency of the second pre-reference clock signal CLKPR2. The second pre-reference clock signal CLKPR2 is then divided by the loop-divider by an integer NSb into the fourth clock signal CLK4, that is, $$f4 = fpr2/Nsb \quad (13).$$

Combining (2) with (3), we get f4=f2/NSa*NSb, which means $$NS = NSa*NSb \quad (13').$$

In the embodiment, MSb is required to be a divisor of NSb, that is, $$LCM(MSb,NSb) = NSb \quad (14),$$

where LCM(MSb,NSb) is the least common multiple of MSb and NSb. This requirement renders the frequency fpr1 of the first pre-reference clock signal CLKPR1 a common divisor of the frequencies of the first and second clock signal, such that the first pre-reference clock signal CLKPR1 can be used as the sample clock signal CLKS for the detection of the synchronizing edges of the first and second clock signal.

Figure 11:
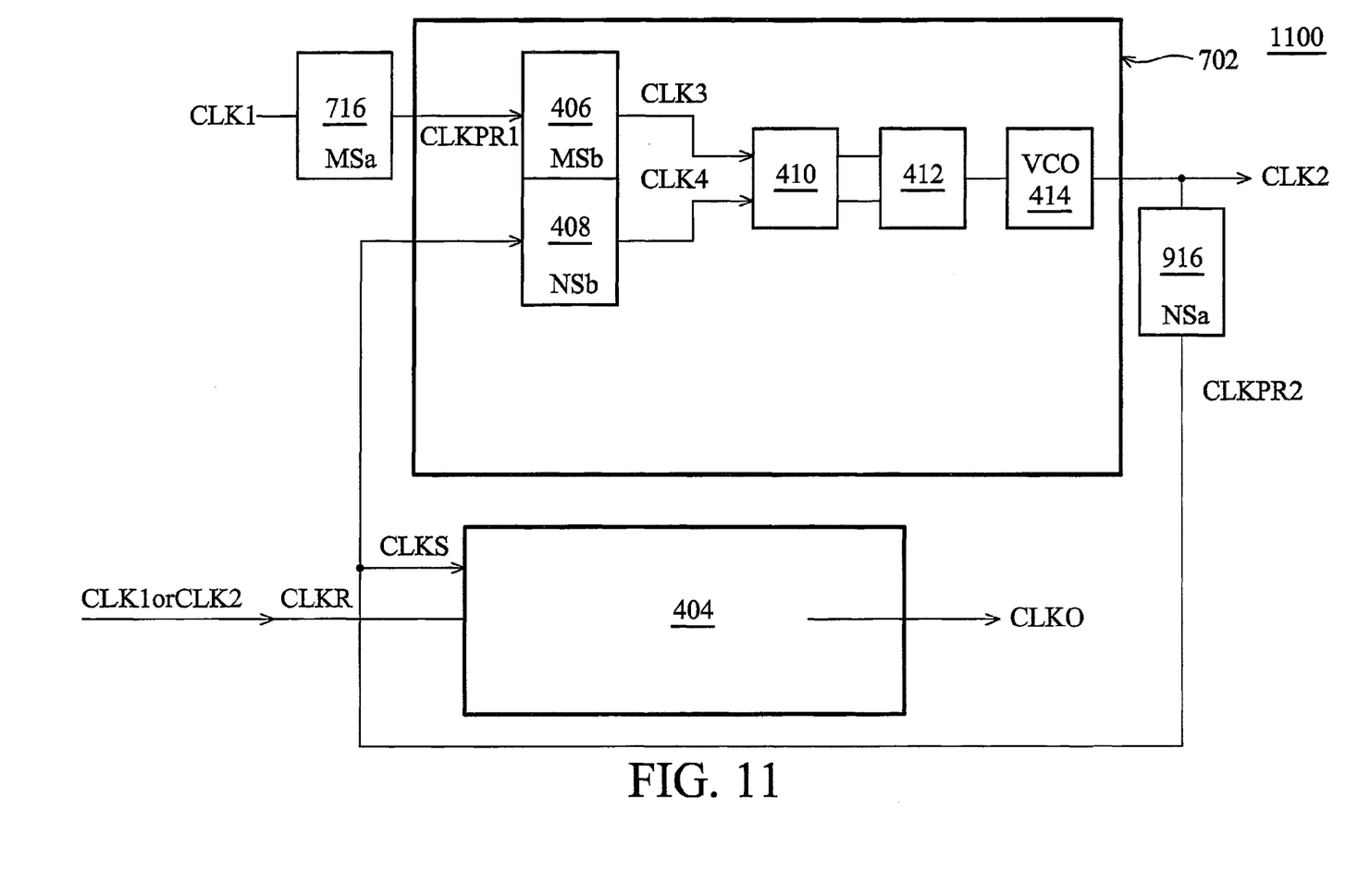
FIG. 11 is a schematic diagram of a synchronizing-edge detector in accordance with another embodiment of the invention.

FIG. 11 is a schematic diagram of a phase locked loop (PLL) system 1100 in accordance with another embodiment of the invention. The PLL system 1100 comprises a conventional PLL apparatus 702, a synchronizing-edge detector 404, a first divider 716 and a second divider 916. As shown, The PLL system 1100 is in all respects except one the same as PLL system 900 of FIG. 9 and formula (1) is still a target. The difference is the addition of the first divider 716.

The first divider 716 divides the first clock signal CLK1 by an integer MSa into a first pre-reference clock signal CLKPR1, that is, $$fpr1 = f1/MSa \quad (15)$$

where fpr1 is the frequency of the first pre-reference clock signal CLKPR1. The first pre-reference clock signal CLKPR1 is then divided by the pre-divider 716 by an integer MSb into the third clock signal CLK3, that is, $$f3 = fpr1/Msb \quad (16)$$

Combining (15) with (16), we get f3=f1/MSa*MSb, which means $$MS = MSa*NSb \quad (16')$$

Similarly, the first divider 916 divides the second clock signal CLK2 by an integer NSa into a second pre-reference clock signal CLKPR2 which is also fed into the loop-divider 408 and into the synchronizing-edge detector 404 as the sample clock signal CLKS, that is, $$fpr2 = f2/NSa \quad (17)$$

The second pre-reference clock signal CLKPR2 is then divided by the loop-divider by an integer NSb into the fourth clock signal, that is, $$f4 = fpr2/Nsb \quad (18)$$

Combining (10) with (11), we get f4=f2/NSa*NSb, which means $$NS = NSa*NSb \quad (18')$$

In the embodiment, NSb is required to be a divisor of MSb, that is, $$LCM(MSb, NSb) = MSb \quad (19)$$

where LCM(MSb,NSb) is the least common multiple of MSb and NSb. This requirement renders the frequency fpr2 of the second pre-reference clock signal CLKPR2 a common divisor of the frequencies of the first and second clock signal, such that the second pre-reference clock signal CLKPR2 can be used as the sample clock signal CLKS for the detection of the synchronizing edges of the first and second clock signal.

In conclusion, the invention can be migrated into the conventional PLL readily. The invention does not require the type of the conventional PLL apparatus to be added with the detection terminal or to be coupled to additional dividers for detection of the input and output clock signals of the new PLL apparatus. Further, the synchronizing detector provides high speed at lower costs.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for indicating synchronizing edges of first clock and second clock signals, wherein the first and second clock signals have a gear ratio relationship, the second clock signal is synchronized with the first clock signal by a phase locked loop (PLL) comprising a pre-divider coupled to the first clock signal to divide a first input clock signal by a first integer into a third clock signal of a third frequency and a loop-divider coupled to the second clock signal to divide a second input clock signal by a second integer into a fourth clock signal of a fourth frequency, wherein the third and fourth frequencies are the same when the PLL is locked, the method comprising:

obtaining a sample clock signal the frequency of which is a common divisor of the first and second clock signals by dividing the first or second clock signal; and generating an output clock signal indicative of the synchronizing edges of the first and second clock signals by detecting the edges of the sample clock signal, wherein generating the output clock signal at the synchronizing edges of the first clock signal and the second clock signal comprises:

employing the first or second clock signal as a reference clock signal;

generating a global signal asserted by the rising edges of the sample clock signal;

generating a local signal asserted by a counting signal when the counting signal reaches a first value, wherein the counting signal is incremented on each edge of the reference signal and is reset by the global and local clock signals; and generating the output clock signal asserted when the counting signal reaches a second value.

2. The method of claim 1, wherein obtaining the sample clock signal comprising:

employing the first clock signal as the first input clock signal;

employing the second clock signal as the second input clock signal; and employing the third or fourth clock signal as the sample clock signal.

3. The method of claim 2, wherein obtaining the sample clock signal comprises providing the PLL with a detection terminal coupled to the sample clock signal to be accessed externally from the PLL to generate the output clock signal.

4. The method of claim 1, wherein obtaining the sample clock signal comprises:

determining two integers MS and NS such that f1/MS=f2/NS;

decomposing MS into MSa and MSb such that MSb is a divisor of NS;

providing a first divider dividing the first clock signal by MSa into the first input clock signal and the sample clock signal;

employing MSb as the first integer and NS as the second integer; and employing the second clock signal as the second input clock signal.

5. The method of claim 1, wherein obtaining the sample clock signal comprises:

determining two integers MS and NS such that f1/MS=f2/NS;

decomposing NS into NSa and NSb such that NSb is a divisor of MS;

providing a second divider dividing the second clock signal by NSa into the second input clock signal and the sample clock signal;

employing MS as the first integer and NSb as the second integer; and employing the first clock signal as the first input clock signal.

6. The method of claim 1, wherein obtaining the sample clock signal comprises:

determining two integers MS and NS such that f1/MS=f2/NS;

decomposing MS into MSa and MSb and decomposing NS into NSa and MSb, such that NSb is a divisor of MSb;

providing a first divider dividing the first clock signal by MSa into the first input clock signal and the sample clock signal;

providing a second divider dividing the second clock signal by NSa into the second input clock signal; and employing MSb as the first integer and NSb as the second integer.

7. The method of claim 1, wherein obtaining the sample clock signal comprises:

determining two integers MS and NS such that f1/MS=f2/NS;

decomposing MS into MSa and MSb and decomposing NS into NSa and MSb, such that MSb is a divisor of NSb;

providing a first divider dividing the first clock signal by MSa into the first input clock signal;

providing a second divider dividing the second clock signal by NSa into the second input clock signal and the sample clock signal; and employing MSb as the first integer and NSb as the second integer.

8. A phase locked loop (PLL) system, wherein the PLL system receives a first clock signal and provides a second clock signal synchronized with the first clock signal when the PLL system is locked, wherein the second clock signal has a gear relationship with the first clock signal, comprising:

a pre-divider coupled to the first clock signal to generate a third clock signal;

a loop-divider coupled to the second clock signal to generate a fourth clock signal, wherein the frequencies of the third and fourth clock signals are substantially equal when the PLL system is locked;

a phase comparator making a comparison between the third and fourth clock signals;

a charge pump circuit producing a control voltage based on the output of the phase comparator;

a voltage-controlled oscillator to generate the second clock signal based on the control voltage;

a detection terminal connected with the third or fourth clock signal to be accessed for the detection of the synchronizing edges of the first and second clock signals; and a synchronizing-edge detector receiving a sample clock signal from the detection terminal to perform a detection of the synchronizing edges of the first and second clock signals, wherein the synchronizing-edge detector comprises:

a counter generating a counting signal incremented on each edge of the first or second clock signal;

a global reset module generating a global signal asserted by the rising edges of the sample clock signal to reset the counting signal;

a local reset module generating a local signal to reset the counting signal together with the global signal, wherein the local signal is asserted by the counting signal when the counting signal reaches a first value; and an informing circuit generating an output clock signal indicative of the synchronizing edges of the first and second clock signals when the counting signal reaches a second value.

9. A phase locked loop (PLL) system, comprising:

a PLL apparatus receiving a first clock signal of frequency f1 to provide a second clock signal of frequency f2 synchronized with the first clock signal when the PLL system is locked, wherein the second clock signal has a gear relationship with the first clock signal;

at least one divider coupled to the first and/or second clock signals to generate a sample clock signal the frequency of which is a common divisor of the first and second clock signals; and a synchronizing-edge detector to generate an output clock signal indicative of the synchronizing edges of the first and second clock signals by detecting the edges of the sample clock signal, wherein the synchronizing-edge detector comprises:

a counter generating a counting signal incremented on each edge of the first or second clock signal;

a global reset module generating a global signal asserted by the rising edges of the sample clock signal to reset the counting signal;

a local reset module generating a local signal to reset the counting signal together with the global signal, wherein the local signal is asserted by the counting signal when the counting signal reaches a first value; and an informing circuit generating the output clock signal asserted when the counting signal reaches a second value.

10. The PLL system as claimed in claim 9, wherein the PLL apparatus comprises a pre-divider dividing its input signal by a first integer into a third clock signal;

a loop-divider dividing ins input signal by a second integer into a fourth clock signal, wherein the frequency of the third and fourth clock signals are substantially equal as the PLL system is locked;

a phase comparator making a comparison between the third and fourth clock signals;

a charge pump circuit producing a control voltage based on the output of the phase comparator; and a voltage-controlled oscillator generating the second clock signal based on the control voltage.

11. The PLL system as claimed in claim 10, wherein the at least one divider comprises a first divider dividing the first clock signal by MSa into the input signal of the pre-divider and the sample clock signal;

the second clock signal is the input signal of the loop-filter; and

MSa, MSb, and NS are set such that f1/(MSa*MSb)=f2/NS and MSb is a divisor of NS, wherein MSb and NS are the first and second integers respectively.

12. The PLL system as claimed in claim 10, wherein the at least one divider comprises a second divider dividing the second clock signal by NSa into the input signal of the loop-divider and the sample clock signal;

the first clock signal is the input signal of the pre-filter; and

MS, NSa, and NSb are set such that f1/MS=f2/(NSa*NSb) and NSb is a divisor of MS, wherein MS and NSb are the first and second integers respectively.

13. The PLL system as claimed in claim 10, wherein the at least one divider comprises a first divider dividing the first clock signal by MSa into the input signal of the pre-divider and the sample clock signal and a second divider dividing the second clock signal by NSa into the input signal of the loop-divider;

NSa, NSb, MSa, and NSb are set such that f1/MSa*MSb=f2/NSa*MSb and MSb is a divisor of NSb, wherein MSb and NSb are the first and second integers respectively.

14. The PLL system as claimed in claim 10, wherein the at least one divider comprises a first divider dividing the first clock signal by MSa into the input signal of the pre-divider and a second divider dividing the second clock signal by NSa into the input signal of the loop-divider and the sample clock signal; NSa, NSb, MSa, and NSb are set such that f1/(MSa*MSb)=f2/(NSa*MSb) and NSb is a divisor of MSb, wherein MSb and NSb are the first and second integers respectively.

* * * * *